(12) United States Patent
Degani et al.

(10) Patent No.: US 6,734,539 B2
(45) Date of Patent: May 11, 2004

(54) STACKED MODULE PACKAGE

(75) Inventors: Yinon Degani, Highland Park, NJ (US);
Thomas Dixon Dudderar, Chatham, NJ (US); Liguo Sun, Dallas, TX (US); Meng Zhao, Plano, TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/964,009

(22) Filed: Sep. 26, 2001

(65) Prior Publication Data
US 2002/0079568 A1 Jun. 27, 2002

Related U.S. Application Data
(60) Provisional application No. 60/258,410, filed on Dec. 27, 2000.

(51) Int. Cl.[7] .................. H01L 23/02; H01L 29/40
(52) U.S. Cl. .............. 257/686; 257/723; 257/777; 257/779; 257/659; 257/773
(58) Field of Search ................. 257/685–686, 257/659, 723–724, 725, 778–780, 774, 777, 773, 786, 737–738, 728, 676, 684; 438/613–617, 74, 107–109; 228/180.22

(56) References Cited

U.S. PATENT DOCUMENTS

| | | | |
|---|---|---|---|
| 5,786,986 A | * | 7/1998 | Bregman et al. |
| 5,955,789 A | * | 9/1999 | Vendramin |
| 5,994,166 A | * | 11/1999 | Akram et al. |
| 6,232,667 B1 | * | 5/2001 | Hultmark et al. |

* cited by examiner

Primary Examiner—Long Pham
Assistant Examiner—DiLinh Nguyen

(57) ABSTRACT

The specification describes an MCM package which contains both a digital MCM and an RF MCM in a stacked configuration. The package contains means for isolating RF signals from digital signals. In one case the digital MCM substrate is attached to the system substrate and the RF MCM substrate is attached to the digital MCM substrate. Solder bumps are used for attachment in an arrangement resembling a BGA. For high density packages, at least the digital MCM comprises stacked IC chips. In the embodiment with the RF MCM substrate on the top of the stack, Passive Through Interconnections (PTIs) are made through the digital MCM substrate, and electrically isolated therefrom. The passive through interconnections are made through the solder bumps between boards and interconnected using a passive (with respect to the digital MCM board) through hole. Both the RF ground and the RF input can be isolated using PTIs. For additional isolation, the solder bumps comprising the PTIs are shielded with a Faraday cage. The Faraday cage comprises an array of solder bumps surrounding the solder bump RF conductors.

17 Claims, 4 Drawing Sheets

STACKED MODULE PACKAGE

RELATED APPLICATIONS

This application claims the benefit of provisional application Ser. No. 60/258,410 filed Dec. 27, 2000, which is assigned to the assignee of the present invention and which is incorporated herein by reference.

FIELD OF THE INVENTION

This invention relates to fabrication of semiconductor integrated circuit (IC) devices, and more specifically to fabrication of stacked multi-chip modules (MCMs) containing both RF and digital MCMs.

BACKGROUND OF THE INVENTION

In a continuing effort to reduce the size of IC packages, proposals for stacking IC chips, and stacking IC chip modules, have emerged in the IC packaging and IC integration technologies. See for example, U.S. Pat. No. 6,222,265. In many of these proposals, the IC devices that are combined in various stacked arrangements are digital IC circuits. Included in the more recent ones, are proposals for integrating both digital and memory chips in a single package, where the memory chip(s) is stacked on the logic chip(s) or vice versa. A wide variety of combinations have been proposed. However to date, combining RF chips and digital chips in a tightly packed, stacked arrangement has been avoided. This is due to the sensitivity of the RF chip or module to noise interference from other IC devices. To avoid this signal interference, RF chips are typically isolated physically from digital chips. They may be mounted on the same motherboard, but usually occupy a separate space on the board.

Stacked arrangements combining RF and digital IC chips would be desirable from the standpoint of miniaturization, but have been avoided due to the problem just outlined. It would be especially desirable to have packages with stacked RF and digital MCMs.

Statement of the Invention

We have developed a stacked MCM package in which both RF and digital MCMs are stacked together. The I/Os in the RF MCM are isolated from the digital MCM by routing dedicated RF I/O interconnections straight through the digital MCM. These I/O interconnections, termed here Passive Through Interconnections (PTIs), comprise solder bumps (alternatively solder balls) in the stacked module package, and a through hole interconnection through the intermediate substrate, typically through the digital MCM substrate. An RF shield is provided for the RF MCM using a ground plane in the RF MCM board, preferably a dedicated ground plane, and a metal shield over the top of the RF MCM. Antenna connections to the RF MCM may be provided using a PTI, and the solder bumps in the gap between MCM substrates in the stack may be shielded using a Faraday cage. Advantageously, the Faraday cage comprises an array of passive solder bumps surrounding the RF solder bump conductors. The passive solder bumps are tied to a common ground to effect the shield. The common ground is preferably a dedicated RF ground made using a PTI.

The preferred implementation of the invention uses stacked Ball Grid Array (BGA) boards. However, the principles of the invention are also applicable to leaded and pin grid array packages.

DETAILED DESCRIPTION

The invention applies to a large variety of MCM arrangements. The following description illustrates the kinds of MCM devices that may be incorporated into the stacked package of the invention. It also illustrates the high packing density made possible by stacking IC chips in MCMs on a two sided interconnect substrate, and then stacking those MCMs according to the invention.

Figure 1:
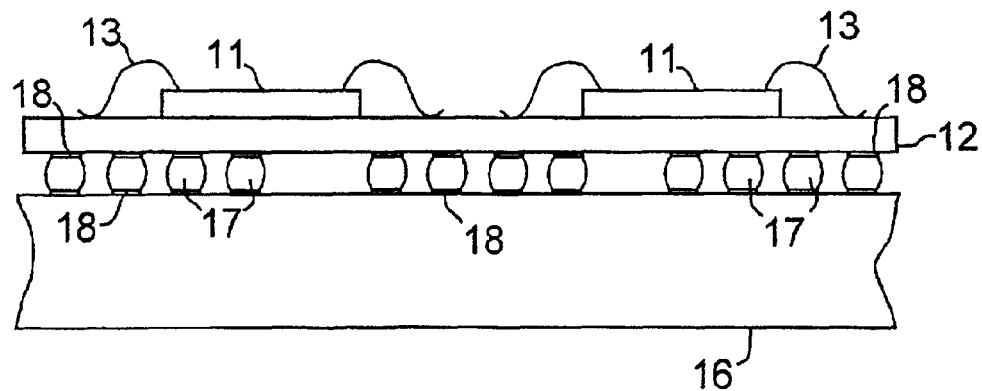
FIG. 1 is a schematic view of one embodiment of a BGA IC package.

A conventional BGA package is shown in FIG. 1. IC chip 11 is die bonded to interconnect substrate 12. The IC chip is typically a silicon chip but may also comprise a III–V semiconductor chip, e.g. of GaAs or InP, for high speed transistors or photonic devices. The interconnect substrate 12 is typically a circuited laminate made of standard epoxy glass or other suitable material. It may be a single level board or a multilevel board. Bond pads (not shown) on the IC chip are interconnected to bond pads (not shown) on the interconnect substrate by wire bonds 13. The substrate 12 is interconnected to the next board level, typically a motherboard 16, by the array of solder balls 17. The solder balls are usually attached to BGA bond pads or under bump metallization 18. FIG. 1 shows two chips mounted on substrate 12, to form a Multi-Chip Module (MCM), but as understood in the art, a conventional BGA contains a single chip. Also there may be more than two chips mounted in similar fashion. The wire bonds in this view suggest a single row of in-line wires, but multiple rows of wire bonds, in-line or staggered, are commonly used.

This package design, with wire bonds to the IC chip, and large ball bonds to the next interconnect level, is robust and inexpensive. However, as recognized by those skilled in the art, the chip density, and the density of I/O interconnections, in this package is modest.

Figure 2:
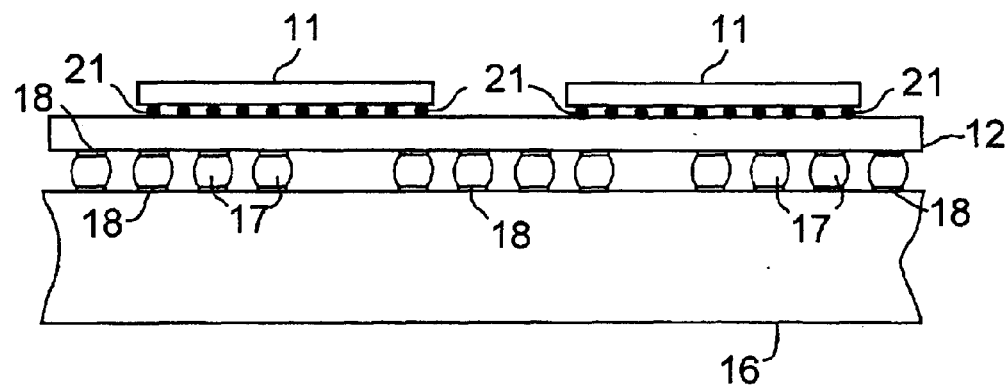
FIG. 2 is a schematic view of a second embodiment of a BGA package.

FIG. 2 is a similar BGA package wherein IC chips 11 are flip-chip bonded to substrate 12 using microbumps 21.

We have recognized that state of the art IC chips can be made thin enough that they can be mounted in the space between the board 12 and the support substrate 16. Devices based on this concept are described and claimed in our U.S. application Ser. No. 09/528,882, filed Mar. 20, 2000, which application is incorporated herein by reference.

Figure 3:
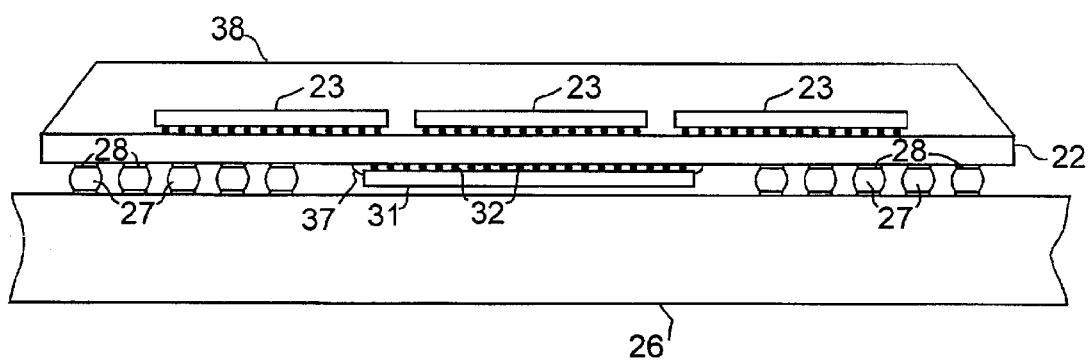
FIG. 3 is a schematic view of one embodiment of a double-sided substrate MCM IC package.

For convenience in this description the space between the board 12 and the support substrate 16 will be referred to as the "BGA gap". A BGA package designed according to the application referenced above is shown in FIG. 3, where IC chips 23 are flip chip bonded to interconnect substrate 22 as in FIG. 2. The substrate 22 is interconnected to motherboard 26 by solder balls 27 and BGA bond pads 28. Attached to the underside of the substrate 22, in the BGA gap, is an IC chip 31. This IC chip is flip-chip bonded to the underside of substrate 22 using solder bumps 32. Solder bumps 32 are typically provided with under bump metallization (not shown).

In the arrangement shown in FIG. 3, a single IC chip is mounted in the BGA gap. Other arrangements may include multiple chips in the BGA gap. For clarity, vias for interconnections between IC chips 23 and 31 are not shown in FIG. 3.

In a preferred form of this device, both memory chips and logic/controller chips are integrated in the same package. For example, the IC chips 23 may be memory IC chips and the IC chip(s) 31 in the array on the underside of substrate 22 may be a logic/controller IC chip. Obviously, the memory and logic/controller chips may be reversed. As shown, the standoff between motherboard 26 and substrate 22, i.e. the BGA gap thickness, is sufficient to accommodate the thickness of the IC chip 31. In a typical BGA package, this standoff distance is approximately 15–25 mils. The usual wafer thickness for IC devices is 26–30 mils. Thus the wafers may be thinned prior to dicing to reduce the IC chip thickness to below the BGA standoff dimension. Thinning of IC chips is conventional, and in state of the art IC technology is performed routinely. IC chips are typically thinned to 10–15 mils.

While not shown, it will be understood by those skilled in the art that printed circuits are provided on substrate 22. The printed circuits interconnect IC chips 23, IC chip 31, and BGA balls 27. It will also be understood that a wide variety of interconnection circuits may be used for the invention. The printed circuits on the upper and lower sides of substrate 22 may extend over the entire available surface. This large surface area adds significantly to the design flexibility of the interconnection patterns. It is also practical to add interconnection circuits to substrate 26. Moreover, it should be understood that either or both of substrate 22 motherboard 26 can be multilevel printed circuit boards.

For a robust IC package, the cavity under IC chip 31 in FIG. 3 may be underfilled with an epoxy if desired, as shown at 37, and the IC chip 21 may be overmolded with plastic, as shown at 38, or otherwise enclosed as required by the application.

Figure 4:
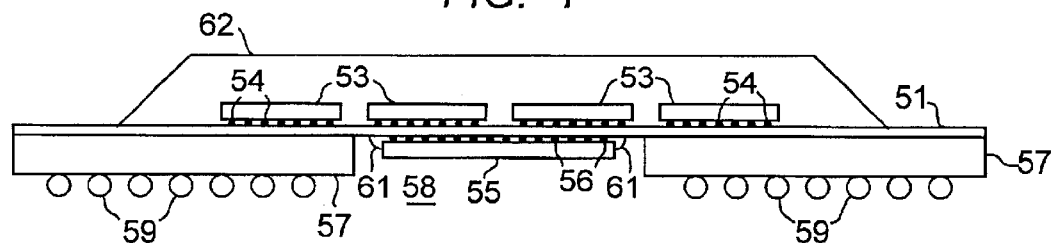
FIG. 4 is a an optional modification of the MCM of FIG. 3.

An alternative arrangement to FIG. 3 is shown in FIG. 4 wherein the gap for the flip-chip bonded IC chip on the bottom of the substrate is provided by using a composite substrate with an aperture formed in the composite substrate to accommodate the IC chip(s). The size of the gap (vertical dimension) in this arrangement is larger than the size of the BGA gap, and may be used to accommodate more, or larger, IC chips.

The arrangement of FIG. 4 employs a flexible substrate with IC chips mounted on both sides of the flexible substrate. This design is described and claimed in U.S. patent application Ser. No. 09/498,005 filed Feb. 4, 2000, which is incorporated herein by reference. In FIG. 4, flexible substrate 51 carries a plurality of IC memory chips 53 bonded with solder bumps 54 to the top of the substrate. A logic IC chip 55 is bonded with solder bumps 56 to the underside of substrate 51. The flexible substrate has printed circuit interconnections (not shown for clarity) on both sides of the flexible substrate providing interconnections for the IC chips. The flexible substrate 51 is bonded to a support substrate 57 which may be any appropriate rigid board that has interconnection sites on both sides. Support substrate 57 is preferably a standard epoxy printed wiring board. The term rigid in the context of this prescription is intended to mean any board structure with rigidity greater than that of the flexible substrate 51. The support substrate 57 is provided with openings 58 to accommodate the IC chips mounted on the underside of the flexible substrate.

Support substrate 57 adds a second level of interconnection, and has through hole interconnections (not shown) for interconnecting the multiple chips 53 to the ball grid array (BGA) shown at 59. IC chip 55 is interconnected to the BGA by a printed circuit on the lower surface of the flexible substrate 51. The BGA balls 59 are connected to the next board level. The advantage of having a large pitch at this level in the package is that support substrate 57 can be flip bonded to a printed wiring board using large BGA solder bumps or balls 59. Large solder interconnections are very reliable and can be made with high yield. The solder bump sites on the flexible substrate 51 are preferably pads incorporated in the copper printed circuits and the solder bumps can be soldered directly to the copper pads. To render the package of FIG. 4 more robust, underfill may be added as represented by 61, and an overmolding provided as shown at 62.

The substrate of FIG. 4 with an aperture formed in the substrate to accommodate the IC chip(s) can also be implemented using a rigid epoxy board with an aperture formed partly through the thickness. Such a board can be made using a multilevel PWB construction by leaving suitable openings in a portion of the top (bottom) levels.

It is evident in the arrangement of FIG. 4 that the footprint of the IC chips mounted on the underside of the flexible substrate is constrained by the openings in the support substrate. However, typical expoxy printed wiring boards, e.g. FR4 boards, have sufficient structural integrity that a large percentage of the board area can be provided with openings such as opening 58. It is also evident from FIG. 4 that the number and arrangement of IC chips on the top surface of flexible substrate 51 is unconstrained.

As shown in FIG. 4, the IC array with the larger footprint will be mounted on the top side of the flexible substrate, where the footprint may exceed the area of the openings in the support substrate 57. Where the multi-chip package contains memory and logic chips, it is preferred that the memory chips be mounted on one side of the flexible substrate, where interconnections between memory chips, especially the $V_{DD}$ and $V_{SS}$ busses, are conveniently accommodated, and the IC logic chips mounted on the other side of the flexible substrate. The memory chip array will typically be the larger array and thus mounted, in the arrangement of FIG. 4, on the side of the flexible substrate that is unconstrained, i.e. is not bonded to the support substrate.

From the variety of designs implicit in the description just given it should be evident that other permutations of package designs in addition to those specifically described are possible. Among these are MCM packages with:

1. Flip-chip bonded or surface mount chip(s) on the top of the substrate with flip-chip bonded chip(s) in the BGA gap.
2. Wire bonded chip(s) on the top of the substrate with wire bonded chip(s) in the BGA gap.
3. Wire bonded chip(s) in the BGA gap with flip-chip or surface mount chip(s) on the top of the substrate.

In each case the mounting of one or more IC chips on both sides of a support substrate is a prominent feature of the MCM package. This list is given by way of example and is not exhaustive of the kinds of MCM arrangements adapted for use with the invention.

Figure 5:
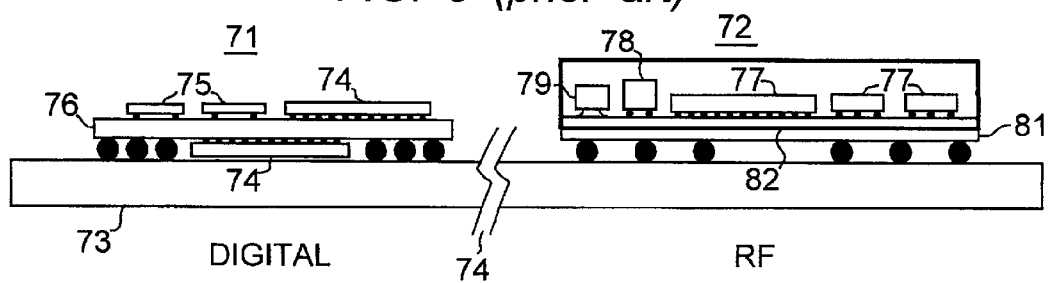
FIG. 5 is a schematic representation of a single substrate having both a digital MCM and an RF MCM.

As mentioned at the outset, in conventional MCM arrangements all of the IC devices are digital devices. It would be desirable from the standpoint of size and cost, to integrate MCMs for RF applications with MCMs for digital applications. The prior art approach to doing this is shown in FIG. 5, where digital MCM 71 and RF MCM 72 are mounted on a common motherboard 73 with a space, represented by break 74, between the digital and RF modules. The break simply be a suitable lateral distance, or alternatively the two MCMs may be mounted on different boards. In either case, by leaving a space between the digital and RF modules, the RF signals from the RF MCM can be electrically isolated from the digital signals. A typical digital MCM 71 may contain an interconnection substrate 76, with two or more ICs, indicated at 74, and two or more passive devices indicated at 75. The RF module comprises substrate 81, and may contain both IC chips, represented by elements 77, and passive component(s), represented by element 78. It may also have an antenna unit, represented by element 79. An important feature of the RF module is RF shield 82. The RF shield is illustrated here as a metal can surrounding the RF elements in the MCM. In typical implementations, the bottom part of the RF shield comprises a ground plane as one level of the support substrate 81. The side and top typically are formed by a metal container attached to substrate 81 and electrically connected to the ground plane 82. The RF shield may be continuous, or may comprise weblike elements. The spaces allowed in the shield are typically much smaller than an RF wavelength.

It will be noted that the footprint of the MCMs in this arrangement equals at least the combined areas of the two MCMs. It would be desirable to package these two MCM units in a stacked configuration. However, such a package is not available to date because of the need to isolate RF signals from digital signals, and the impracticality of doing that in a stacked MCM arrangement.

Figure 6:
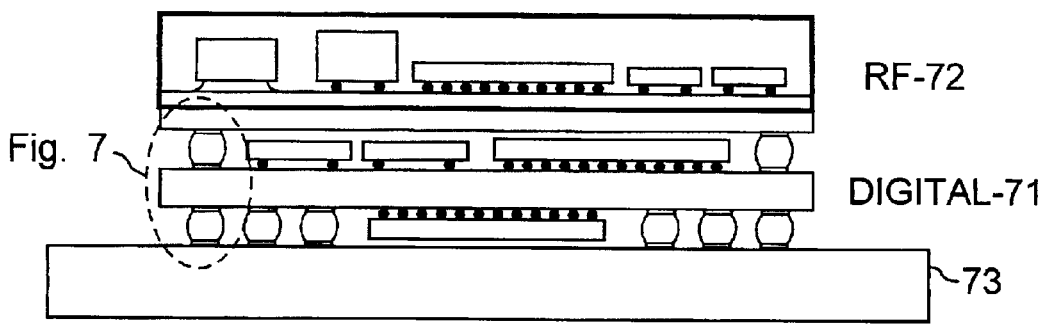
FIG. 6 is a stacked MCM package with both an RF MCM and a digital MCM in the stack.

According to a main feature of this invention, a stacked MCM arrangement has been designed that achieves effective isolation of RF signals in a stacked MCM package. One embodiment of this is shown in FIG. 6. The substrate 73 carries two MCMs in a stacked arrangement, a digital MCM 71 and an RF MCM 72. In other embodiments the positions of the MCMs may be reversed, i.e. the digital MCM stacked on top of the RF MCM. However, it is preferred that the RF MCM be stacked on the top.

The elements in the two MCMs in FIG. 6 are, for illustration, the same as those in FIG. 5. An important feature of the stacked arrangement of FIG. 5 is that certain electrical signals, for example, the ground plane 82, and the RF input to the RF module, which may be the antenna lead, are shielded from the surrounding environment. This means that the RF module, for effective noise suppression, should not share the ground plane with the digital MCM. It also requires that the RF input pass through the digital MCM in a completely passive way. Therefore, to implement this important feature of the invention, interconnections are made from the motherboard, or system interconnection substrate, 73 and the RF MCM 72 without interference from the digital MCM through which they pass. These interconnections are characterized, with respect to the digital MCM, as Passive Through Interconnections (PTIs). They pass through the substrate of the digital MCM without making electrical connection to any element or common interconnection node, on the digital MCM substrate.

Figure 7:
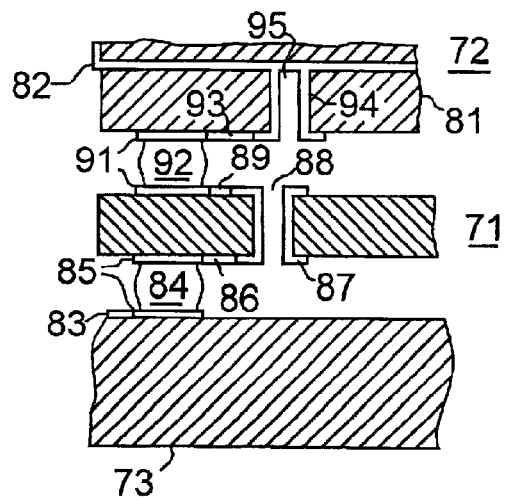
FIG. 7 is a view of a portion of the MCM stack of FIG. 6 showing a PTI for the RF MCM.

An implementation of this interconnection feature is shown in FIG. 7, which represents the portion of the stacked MCM arrangement shown in the dashed oval of FIG. 6. In FIG. 7, portions of the substrate 73, the digital MCM 71 and the RF MCM 72 are shown to illustrate one PTI. In this illustration the PTI is for the ground plane interconnection. A similar arrangement, insofar as the PTI is concerned, may be made for other connections to the RF MCM, e.g. the antenna interconnection. The electrical path in FIG. 7 traces this sequence:

From system board 73, through runner 83, through lower under bump metallization (UBM) 85 of solder bump 84, through solder bump 84, through upper UBM 85 of solder bump 84, through runner 86 on the digital MCM, through metallization 87 of through hole 88 in the digital MCM, through runner 89 on the digital MCM, through lower UBM 91 for solder bump 92, through solder bump 92, through upper UBM 91 for solder bump 92, through runner 93 on the RF MCM through sidewall metallization 94 of through hole 95, to the RF ground plane 82 of RF substrate 81.

For the purpose of the invention it is important that none of the elements 86, 87 and 89 on the digital MCM contact any electrical element or node on the substrate of the digital MCM 71.

As indicated above, it may be desirable for the RF input, in the usual case the RF antenna lead, to be formed in a similar manner. In that case a through hole similar to through hole 95 in FIG. 7 would be provided except that it would extend to the top surface of the RF MCM substrate where the through hole would be connected with, e.g., an RF amplifier IC chip. This arrangement is suitable for the case where the RF antenna is located on the system substrate or connects to the system substrate. In alternative system designs the antenna may be located above the RF MCM and the interconnection made through the top of the RF shield. In that case the RF input may not require a PTI of the kind described by FIG. 7.

Figure 8:
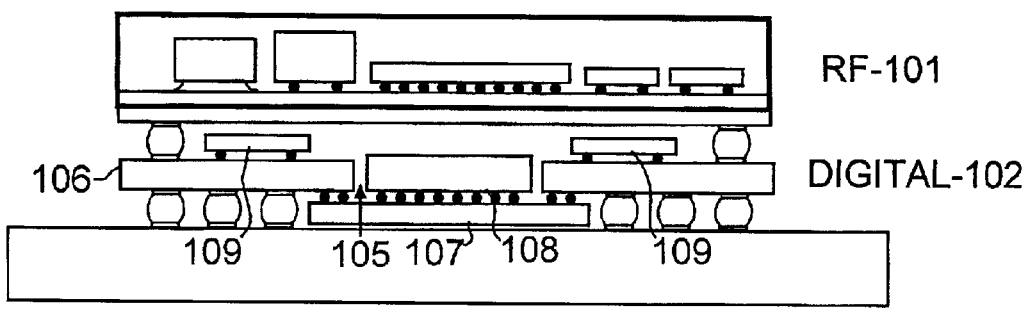
FIG. 8 is an alternative arrangement for stacking both digital and RF MCMs.

FIG. 8 illustrates that the stacked RF MCM (101) arrangement applies to other forms of MCM structures, as pointed out earlier. In FIG. 8, the digital MCM 102 is itself a stacked MCM similar to that of FIG. 4, but where the aperture 105 in substrate 106 extends through the substrate 106. An IC chip 107 is attached to substrate 106 as shown, and IC chip(s) 108 are attached to IC chip 107. Substrate 106 may carry additional IC chips 109 on the top portion of the substrate surrounding aperture 105.

Figure 9:
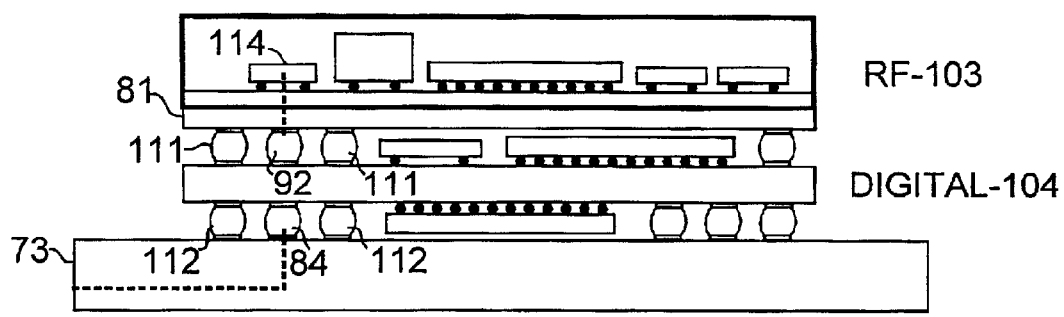
FIG. 9 is an MCM stack similar to that of FIG. 8 but showing a Faraday cage RF shield for one of the I/Os of the RF MCM.
Figure 10:
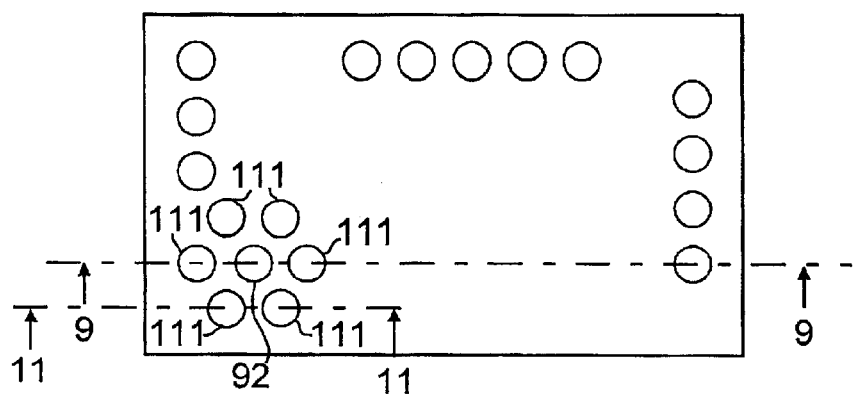
FIG. 10 is a schematic diagram in plan view of the RF MCM of FIG. 9.
Figure 11:
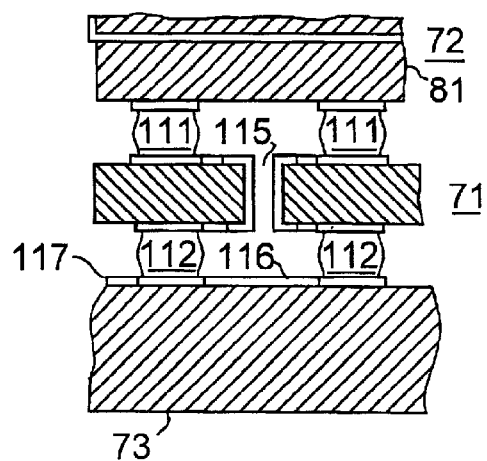
FIG. 11 is a section view corresponding to 11—11 of FIG. 10.

While the PTI described in connection with FIGS. 6 and 7 provides electrical isolation of the sensitive RF signals in the RF MCM, there remains a possibility that stray electrostatic fields in the gap between the RF and digital MCMs will interfere with the signal as it passes through the solder bumps between the MCM substrates, i.e. that the solder bump conductors themselves will pick up interference from stray fields. Accordingly, another feature of the invention is to shield the solder bumps, e.g. 92, 84 of FIG. 7, from stray electrostatic fields. According to this feature of the invention an array of grounded solder bumps is formed around the solder bump carrying the RF signal. The array of solder bumps serves as a Faraday cage. The concept of a Faraday cage is well known. Any conductive body placed around a signal carrying conductor can protect the signal from electrical interference if that body is well grounded. The conductive body is an effective shield even if that body is not continuous, i.e. has holes in it. Thus the familiar cabinets of the early days of radio that were made of sheet metal pierced with large holes. If the openings in the cage are small relative to a signal wavelength it behaves electromagnetically as a continuous sheet. In the implementation of the invention the solder bump Faraday cage array is convenient and compatible with the process technology used in the manufacture of the stacked array. No additional fabrication steps are added. Moreover, it combines the concept of the Faraday cage, in this convenient implementation, with the PTI described earlier. The solder bumps forming the cage are grounded to the system substrate in a manner similar to that used for grounding ground plane 82. This embodiment is shown in FIGS. 9–11, where, as shown in FIG. 9, the RF input is carried by an interconnection (dashed line) between the substrate 73 and device 114 of the RF MCM. Device 114 may be an RF amplifier or other device. The dashed line shows the current path from an interconnect level in the system board 73, through the solder bumps 84 and 92, to device 114 in the RF MCM. This arrangement would by typical where the RF antenna is located remotely from the RF MCM.

When the RF signal is carried by the solder bumps 84 and 92 it is susceptible to stray electromagnetic fields in the BGA gaps between all three boards. The Faraday cages comprising solder bump arrays 111 and 112 protect solder bumps 84 and 92 from interference.

FIG. 9 is a view similar to that of FIG. 6, with stacked RF MCM and digital MCM 103 and 104 respectively, and showing solder bumps 84 and 92 surrounded with Faraday cage solder bumps 111, 112. The positioning of the array of solder bumps 111 is shown more clearly in FIG. 10, which is a schematic diagram in plan view of the solder bumps in the RF MCM of FIG. 9. For the illustration, FIG. 9 is a section through 9—9 of FIG. 10. The solder bump array 111 shields signal carrying solder bump 92 carrying the RF signal through the gap between the digital MCM substrate and the RF MCM substrate. Another array of solder bumps 112 shields the solder bump 84 carrying the RF signal through the gap between the system substrate and the digital MCM substrate.

The solder bumps forming the Faraday cage are grounded to a common ground. This is seen more clearly in FIG. 11, which is a section through 11—11 of FIG. 10, and shows two of the solder bumps 111 in the Faraday cage around solder bump 92, and two of the solder bumps 112 surrounding the solder bump 84. The solder bumps in the arrays 111 and 112 are interconnected to a common ground 117 on the system substrate with runners, e.g. 116, and one or more through holes 115. In this embodiment the common ground connection is made using a PTI as above described. This alternative is preferred for low noise. However, the common ground for the Faraday cages can be tied to the ground plane of the digital MCM if desired, in which case the PTI and one or more through holes can be eliminated.

FIG. 10 shows a solder bump Faraday cage comprising six solder bumps arranged in a hexagonal array. It will occur to those skilled in the art that more, or fewer, solder bumps may be used to effectively screen out stray fields. Typically a minimum of three solder bumps, in a triangular array, would be used.

The term BGA typically refers to large solder balls. Equivalent terms, in the context of the invention are solder balls, and solder bumps. For use herein, solder bump is the generic expression.

Reference to UBM herein typically refers to metal systems for enhancing adhesion of solder bumps to the underlying material, especially aluminum. Where the underlying material is copper, as is the case for runners on standard printed circuit boards, UBM may not be necessary.

The term MCM is used herein to describe the entire multi-chip modules that include IC chips and passive and other components interconnected together on a common MCM substrate. As described earlier the MCM package may include multiple stacked components, multiple stacked boards, etc. The MCM substrate typically comprises a printed circuit. The MCM substrate is typically interconnected to the next interconnection (board) level using solder bumps, also as described above.

For the purpose of defining the invention, it will be recognized that the characteristic of the PTI is that it connects an electrical node on the system substrate to an active electrical node on the RF MCM substrate exclusive of any electrical connection to an active electrical node on the digital MCM substrate. The term active electrical node is intended to mean an electrical node that is connected to an active electrical element on the substrate. Thus the term active electrical node on the digital MCM substrate is intended to mean an electrical node that is connected to an active electrical element on the digital MCM substrate. An active electrical element is an element that performs an electrical function other than just a conductor.

The arrangements described in detail in the foregoing specification show the RF MCM on top of the digital MCM. As mentioned earlier, the reverse arrangement may also be used, i.e. the digital MCM on top of the RF MCM. In this case the digital signals that are routed through the RF MCM may be routed using the PTI of the invention in the same manner shown in FIG. 7. In this embodiment, if a Faraday cage is used, only one Faraday cage, between the system substrate and the RF MCM substrate on top of the system substrate, is required to shield either or both the RF ground and the RF input.

Prior U.S. Pat. Nos. 5,898,223; 5,646,828; 5,990,564; 6,282,100; 6,251,705; 6,232,212; 6,251,705; U.S. application Ser. No. 09/435,971, filed Nov. 8, 1999; U.S. application Ser. No. 09/528,882, filed Mar. 20, 2000; and U.S. application Ser. No. 09/879,759, filed Jun. 12, 2001 all contain MCM package details that supplement those given here and all are incorporated herein by reference.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A stacked MCM package wherein a digital MCM is mounted on a digital MCM substrate and an RF MCM is mounted on an RF MCM substrate, the stacked MCM package further comprising:

a. a first solder bump array connecting the digital MCM substrate to a system substrate;

b. a second solder bump array connecting the RF MCM substrate to the digital MCM substrate;

c. a through hole interconnection through the digital MCM substrate electrically connecting an electrical node on the system substrate to an active electrical node on the RF MCM substrate, the through hole interconnection being electrically insulated from all electrical nodes on the digital MCM substrate.

2. The stacked MCM package of claim 1 wherein the through hole interconnection comprises a first electrically isolated solder bump in the first solder bump array and a second electrically isolated solder bump in the second solder bump array.

3. The stacked MCM package of claim 2 wherein the through hole interconnection from the system substrate to the RF MCM substrate is a ground connection.

4. The stacked MCM package of claim 3 wherein the stacked MCM package comprises an additional through hole interconnection through the digital MCM substrate electrically connecting an electrical node on the system substrate to an active electrical node on the RF MCM substrate, the additional though hole interconnection being electrically insulated from all electrical nodes on the digital MCM substrate, and wherein the additional through hole interconnection from the system substrate to the RF MCM substrate is an RF input connection.

5. The stacked MCM package of claim 2, wherein the through hole interconnection from the system substrate to the RF MCM substrate is an RF input connection.

6. The stacked MCM package of claim 5 wherein the RF input connection is connected to an RF antenna.

7. The stacked MCM package of claim 2 further comprising a Faraday cage around the first electrically isolated solder bump.

8. The stacked MCM package of claim 7 wherein the Faraday cage comprises at least three solder bumps arranged around the first electrically isolated solder bump, with the at least three solder bumps of the Faraday cage connected to a common ground.

9. The stacked MCM package of claim 7 wherein a common ground is the ground for the RF MCM.

10. A stacked MCM package wherein an RF MCM is mounted on an RF MCM substrate and a digital MCM is mounted on a digital MCM substrate, the stacked MCM package further comprising:

a. a first solder bump array connecting the RF MCM substrate to the system substrate;

b. a second solder bump array connecting the digital MCM substrate to the RF MCM substrate;

c. a through hole interconnection through the digital MCM substrate electrically connecting an electrical node on the system substrate to an active electrical node on the digital MCM substrate, the through hole interconnection being electrically insulated from all electrical nodes on the RF MCM substrate.

11. The stacked MCM package of claim 10 wherein the through hole interconnection comprises a first electrically isolated solder bump in the first solder bump array and a second electrically isolated solder bump in the second solder bump array.

12. The stacked MCM package of claim 11 wherein the through hole interconnection from the system substrate to the digital MCM substrate is a ground connection.

13. The stacked MCM package of claim 11 wherein the through hole interconnection from the system substrate to the digital MCM substrate is a digital input connection.

14. The stacked MCM package of claim 11 wherein the stacked MCM package comprises an additional through hole interconnection through the RF MCM substrate electrically connecting an electrical node on the system substrate to an active electrical node on the digital MCM substrate, the additional though hole interconnection being electrically insulated from all electrical nodes on the RF MCM substrate, and wherein the additional through hole interconnection from the system substrate to the digital MCM substrate is a digital input connection.

15. The stacked MCM package of claim 10 further comprising a Faraday cage around a first electrically isolated solder bump.

16. The stacked MCM package of claim 15 wherein the Faraday cage comprises at least three solder bumps arranged around the first electrically isolated solder bump, with the at least three solder bumps of the Faraday cage connected to a common ground.

17. The stacked MCM package of claim 16 wherein the common ground is the ground for the digital MCM.

* * * * *